US011428754B2

(12) United States Patent
Izumi et al.

(10) Patent No.: US 11,428,754 B2
(45) Date of Patent: Aug. 30, 2022

(54) CONNECTOR INSPECTION INSTRUMENT, CONNECTOR SET

(71) Applicant: KYOCERA Document Solutions Inc., Osaka (JP)

(72) Inventors: Koji Izumi, Osaka (JP); Tomohiko Yamakawa, Osaka (JP); Masaru Takagi, Osaka (JP); Hayato Mori, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 297 days.

(21) Appl. No.: 16/748,029

(22) Filed: Jan. 21, 2020

(65) Prior Publication Data

US 2020/0233042 A1 Jul. 23, 2020

(30) Foreign Application Priority Data

Jan. 22, 2019 (JP) ............................ JP2019-008242

(51) Int. Cl.

| | |
|---|---|
| ***G01R 31/69*** | (2020.01) |
| ***H01R 12/71*** | (2011.01) |
| ***H01R 27/02*** | (2006.01) |
| ***H01R 13/66*** | (2006.01) |
| ***H01R 24/68*** | (2011.01) |

(52) U.S. Cl.

CPC ........... *G01R 31/69* (2020.01); *H01R 12/716* (2013.01); *H01R 13/6691* (2013.01); *H01R 24/68* (2013.01); *H01R 27/02* (2013.01); *H01R 2201/20* (2013.01)

(58) Field of Classification Search

CPC .. G01R 31/69; H01R 12/716; H01R 13/6691; H01R 24/68; H01R 27/02; H01R 2201/20; H01R 13/641; H01R 12/71

See application file for complete search history.

(56) References Cited

U.S. PATENT DOCUMENTS

| | | | | |
|---|---|---|---|---|
| 2006/0119368 A1* | 6/2006 | Sela | G01R 31/52 | 324/522 |
| 2008/0318467 A1* | 12/2008 | Denomme | H01R 31/08 | 439/511 |
| 2013/0181698 A1* | 7/2013 | Rutheiser | B64F 5/60 | 324/103 R |

(Continued)

FOREIGN PATENT DOCUMENTS

JP 2001217048 A 8/2001

*Primary Examiner* — Akm Zakaria

(74) *Attorney, Agent, or Firm* — Alleman Hall Creasman & Tuttle LLP

(57) ABSTRACT

A receptacle includes a pair of spare terminals that are located on both sides of a plurality of receptacle terminals in a longitudinal direction and are short-circuited. A plug includes a pair of relay electrodes that respectively come in contact with the pair of spare terminals when the plug is connected to the receptacle. A connector inspection instrument includes a conduction detecting circuit and a pair of terminal support portions supporting a pair of inspection terminals, and a displacement mechanism. The displacement mechanism supports one or both of the pair of terminal support portions in such a way as to displace the one or both of the pair of terminal support portions in a width direction to narrow or widen an interval between the pair of inspection terminals.

4 Claims, 7 Drawing Sheets

(56) References Cited

U.S. PATENT DOCUMENTS

| | | | | |
|---|---|---|---|---|
| 2013/0194734 A1* | 8/2013 | Yoshikawa | .......... | H01R 13/665 361/679.01 |
| 2020/0039329 A1* | 2/2020 | Shimizu | .................. | F16B 9/056 |

* cited by examiner

CONNECTOR INSPECTION INSTRUMENT, CONNECTOR SET

INCORPORATION BY REFERENCE

This application is based upon and claims the benefit of priority from the corresponding Japanese Patent Application No. 2019-008242 filed on Jan. 22, 2019, the entire contents of which are incorporated herein by reference.

BACKGROUND

The present disclosure relates to a connector inspection instrument for inspecting connection state of a connector set composed of a receptacle and a plug, and relates to the connector set.

A production process of an electronic device typically includes a process to connect two connectors that constitute a connector set. For example, a plug connected to end portions of a plurality of electric wires is connected to a receptacle mounted on a board. In this case, the receptacle and the plug constitute the connector set.

In addition, there is known a technology in which a connector mounted on a board includes: a connecting pole terminal disposed inside a mold member; and a test pole protruding to outside the mold member. The connecting pole terminal and the test pole are electrically connected with a mounted pole terminal which can be connected electrically with a mounting pattern on the board.

A pair of terminals of a continuity checker are pressed to the mounting pattern and the test electrode. With this configuration, it is possible to inspect the mounting state of the connector without inserting the terminals of the continuity checker into the mold member of the connector.

SUMMARY

A connector inspection instrument according to an aspect of the present disclosure is for inspecting a connection state of a connector set that includes a receptacle and a plug. The receptacle includes: a plurality of receptacle terminals that are aligned in a longitudinal direction of the receptacle; and a pair of spare terminals that are located on both sides of the plurality of receptacle terminals in the longitudinal direction and are short-circuited. The plug includes: a plurality of plug terminals that respectively come in contact with the plurality of receptacle terminals when the plug is connected to the receptacle; and a pair of relay electrodes that respectively come in contact with the pair of spare terminals when the plug is connected to the receptacle. The connector inspection instrument includes a pair of inspection terminals, a conduction detecting circuit, a main-body housing, a pair of terminal support portions, and a displacement mechanism. The pair of inspection terminals are brought into contact with the pair of relay electrodes. The conduction detecting circuit detects conduction between the pair of inspection terminals by applying a voltage to the pair of inspection terminals. The main-body housing stores the conduction detecting circuit. The pair of terminal support portions are formed to extend from the main-body housing and support the pair of inspection terminals. The displacement mechanism is provided in the main-body housing and supports one or both of the pair of terminal support portions in such a way as to displace the one or both of the pair of terminal support portions in a width direction to narrow or widen an interval between the pair of inspection terminals.

A connector set according to another aspect of the present disclosure includes a receptacle and a plug. The receptacle includes a plurality of receptacle terminals, a pair of spare terminals, and a short circuit member. The plurality of receptacle terminals are aligned in a longitudinal direction of the receptacle. The pair of spare terminals are located on both sides of the plurality of receptacle terminals in the longitudinal direction and are short-circuited. The short circuit member is conductive and short-circuits the pair of spare terminals. The plug includes a plurality of plug terminals and a pair of relay electrodes. The plurality of plug terminals respectively come in contact with the plurality of receptacle terminals when the plug is connected to the receptacle. The pair of relay electrodes respectively come in contact with the pair of spare terminals when the plug is connected to the receptacle.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The following describes an embodiment of the present disclosure with reference to the accompanying drawings. It should be noted that the following embodiment is an example of a specific embodiment of the present disclosure and should not limit the technical scope of the present disclosure.

[Configuration of Connector Set 10]

A connector set 10 according to an embodiment of the present disclosure is adopted in an image forming apparatus or other electronic devices. The image forming apparatus is, for example, a printer, a copier, or a multifunction peripheral.

Figure 1:
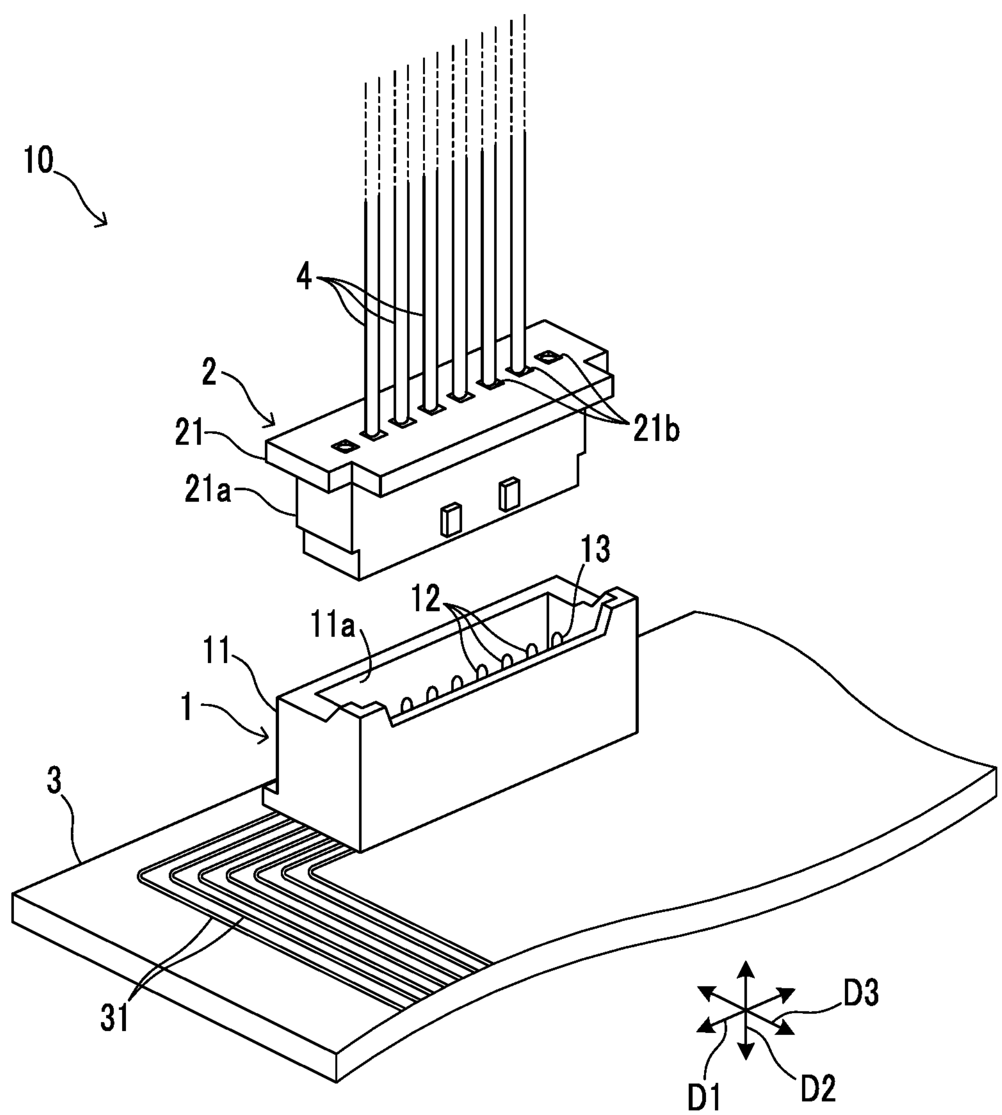
FIG. 1 is a perspective diagram of a connector set before connection, the connector set including a receptacle that is a connector according to an embodiment.
Figure 2:
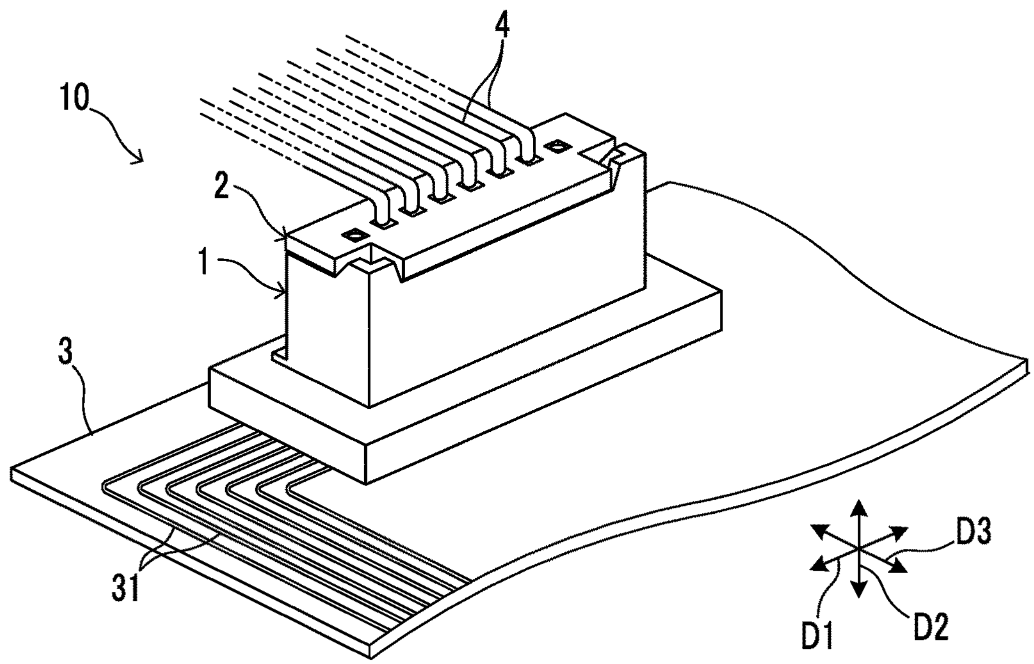
FIG. 2 is a perspective diagram of the connector set after connection, the connector set including the receptacle that is the connector according to the embodiment.

As shown in FIG. 1 and FIG. 2, the connector set 10 includes a receptacle 1 and a plug 2, wherein the receptacle 1 is mounted on an electronic board 3, and the plug 2 is connected to end portions of a plurality of electric wires 4. In a production process of the electronic device, the plug 2 is connected to the receptacle 1.

The receptacle 1 may also be defined as a receptacle-type connector. Similarly, the plug 2 may also be defined as a plug-type connector.

Both the receptacle 1 and the plug 2 have an approximate rectangular shape whose one side extends in a longitudinal direction D1. The plug 2 is connected to and disconnected from the receptacle 1 in a depth direction D2 that is perpendicular to the longitudinal direction D1. It is noted that a direction perpendicular to the longitudinal direction D1 and the depth direction D2 is a thickness direction D3.

The receptacle 1 includes a receptacle body 11 and a plurality of receptacle terminals 12 that are aligned in the longitudinal direction D1. The plurality of receptacle terminals 12 are conductive. The receptacle body 11 is insulative.

The receptacle body 11 is made of synthetic resin and configured to hold the plurality of receptacle terminals 12 at a predetermined position. In the present embodiment, the receptacle body 11 is integrally formed with the plurality of receptacle terminals 12 by the insert molding.

The receptacle body 11 includes a fitting hole 11*a* to which a part of the plug 2 is inserted. Tip portions of the plurality of receptacle terminals 12 are formed to extend in the depth direction D2 in the fitting hole 11*a*.

The plurality of receptacle terminals 12 are electrically connected to a pattern wiring 31 formed on the electronic board 3. The plurality of receptacle terminals 12 are soldered to the pattern wiring 31 such that the receptacle 1 is fixed to the electronic board 3.

Figure 3:
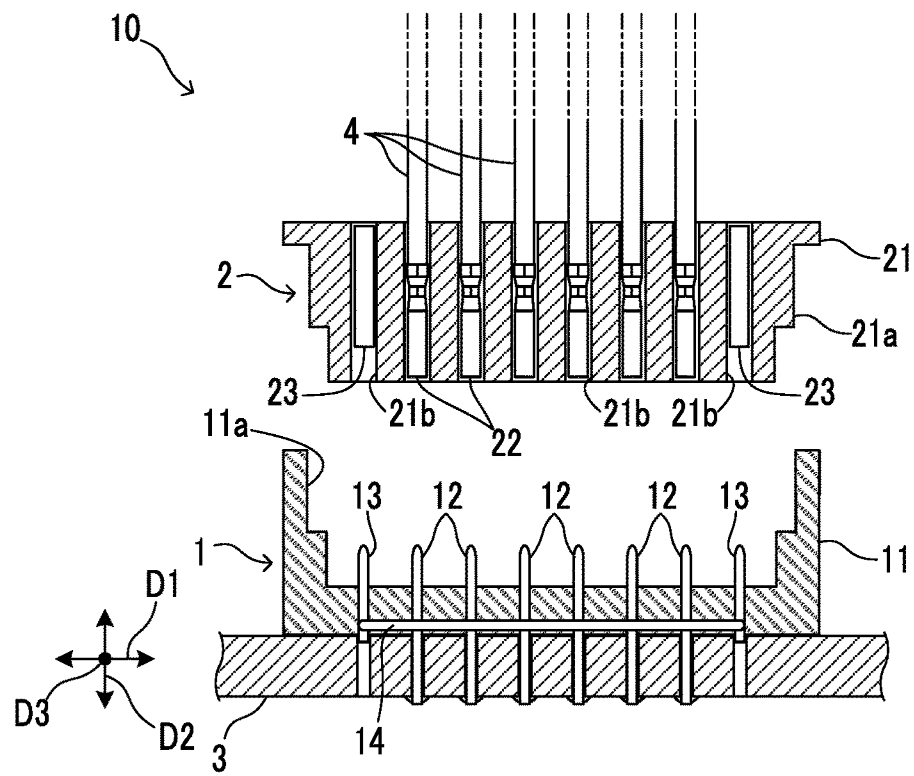
FIG. 3 is a vertical cross-sectional diagram of the connector set before connection, the connector set including the receptacle that is the connector according to the embodiment.
Figure 4:
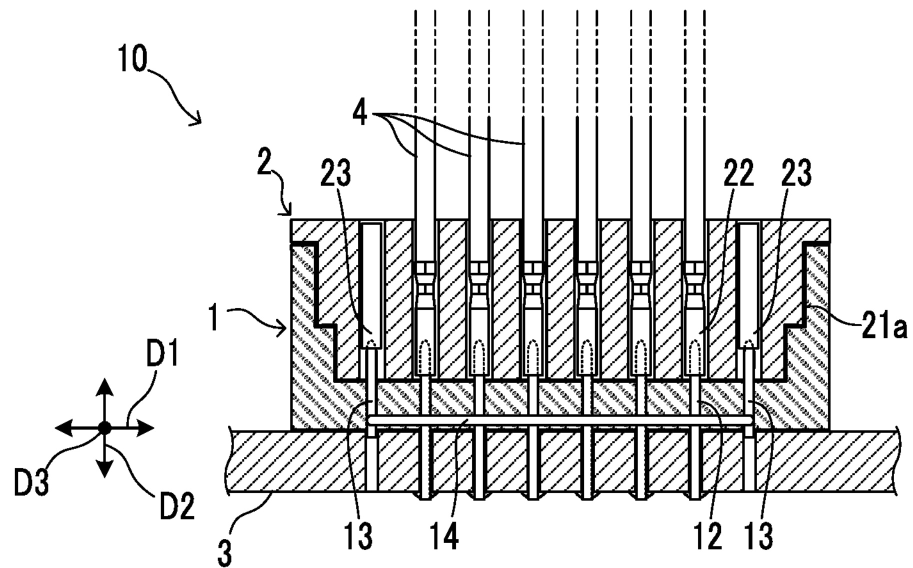
FIG. 4 is a vertical cross-sectional diagram of the connector set after connection, the connector set including the receptacle that is the connector according to the embodiment.

On the other hand, the plug 2 includes a plug body 21 and a plurality of plug terminals 22 that are aligned in the longitudinal direction D1 (see FIG. 3, FIG. 4). The plurality of plug terminals 22 are conductive. For example, each of the plurality of plug terminals 22 is a crimp terminal crimped to an end portion of corresponding one of the electric wires 4.

The plug body 21 is insulative. The plug body 21 is made of synthetic resin and configured to hold the plurality of plug terminals 22 at a predetermined position. A part of the plug body 21 is an insertion portion 21*a* that is fitted in the fitting hole 11*a* of the receptacle body 11.

In the present embodiment, the plug body 21 includes a plurality of cavity portions 21*b*. The plug body 21 holds the plug terminals 22 respectively in the cavity portions 21*b*.

As shown in FIG. 3 and FIG. 4, the insertion portion 21*a* of the plug body 21 is fitted in the fitting hole 11*a* of the receptacle body 11, thereby the plug 2 is connected to the receptacle 1.

When the plug 2 is connected to the receptacle 1, the plurality of plug terminals 22 are respectively in contact with the plurality of receptacle terminals 12.

It is noted that the receptacle body 11 and the plug body 21 include a lock mechanism (not shown) that holds the plug 2 in a state of being connected to the receptacle 1.

Meanwhile, a processor, such as a CPU (Central Processing Unit), electrically connected to the electronic board 3 on which the receptacle 1 is mounted, may execute a process to inspect a connection state between the receptacle 1 and the plug 2.

However, if a connection failure between the receptacle 1 and the plug 2 is detected at a stage where the processor has become operable, a large scale of going back in the production process may be required. For example, a component that has already been attached may be detached to reconnect the plug 2 to the receptacle 1.

It is thus desirable that the inspection of the connection state between the receptacle 1 and the plug 2 can be done in a simple manner at as early a stage as possible in the production process of a product including the connector set 10.

In addition, in many cases, the connection failure between the receptacle 1 and the plug 2 is a failure by one-side floating. The one-side floating is a state where, among the plurality of plug terminals 22 of the plug 2, only one or more terminals at one end in the longitudinal direction D1 are not in sufficient contact with the receptacle terminals 12.

A connector inspection instrument 5 that is described below is configured to inspect a connection failure by one-side floating of the connector set 10 composed of the receptacle 1 and the plug 2, in a simple manner (see FIG. 7 to FIG. 10). Furthermore, the connector set 10 has a configuration that is suitable to inspect a connection failure by one-side floating.

[Characteristics of Connector Set 10]

The following describes characteristics of the connector set 10 for simplifying the inspection of a connection failure by one-side floating with reference to FIG. 3 to FIG. 6.

Figure 6:
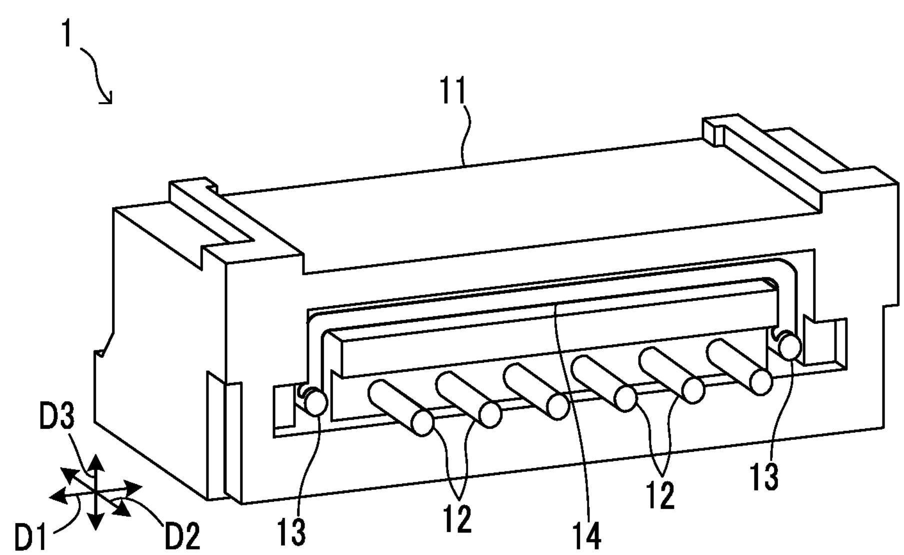
FIG. 6 is a perspective diagram of the receptacle that is the connector according to the embodiment.

As shown in FIG. 3 and FIG. 6, the receptacle 1 further includes a pair of spare terminals 13 and a short circuit member 14. The pair of spare terminals 13 and the short circuit member 14 are conductive. In the present embodiment, the short circuit member 14 is held by the receptacle body 11.

The pair of spare terminals 13 are located on both sides of the plurality of receptacle terminals 12 in the longitudinal direction D1, and are short-circuited. The short circuit member 14 is a conductive member for short-circuiting the pair of spare terminals 13.

The receptacle body 11 is integrally formed with the plurality of receptacle terminals 12 and the pair of spare terminals 13 by the insert molding.

The plug 2 includes a pair of relay electrodes 23 that come in contact with the pair of spare terminals 13 when the plug 2 is connected to the receptacle 1. The plug body 21 includes a plurality of cavity portions 21*b* that correspond to the plurality of plug terminals 22 and the pair of relay electrodes 23. The plug body 21 holds the pair of relay electrodes 23 in two cavity portions 21*b*.

When the plug 2 is connected to the receptacle 1 normally, the pair of relay electrodes 23 are respectively in contact with the pair of spare terminals 13 (see FIG. 4).

In the example shown in FIG. 4, in a state where the plug 2 is connected to the receptacle 1, the length of a region in which the pair of spare terminals 13 overlap with the pair of relay electrodes 23 in the depth direction D2, is shorter than the length of a region in which the plurality of receptacle terminals 12 overlap with the plurality of plug terminals 22 in the depth direction D2.

Figure 5:
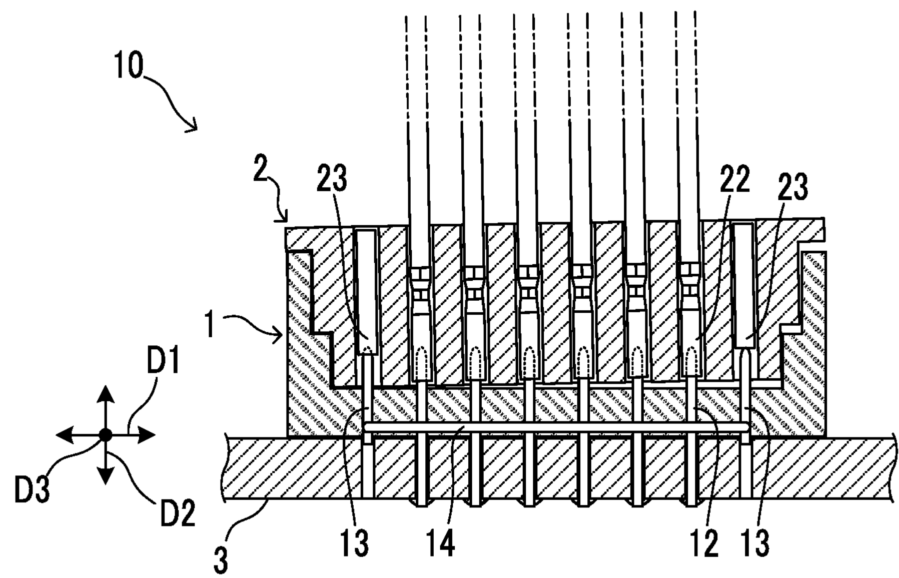
FIG. 5 is a vertical cross-sectional diagram of the connector set in a connection failure state.

As shown in FIG. 5, in the connector set 10, when a connection failure by one-side floating occurs, a connection failure occurs between one of the pair of relay electrodes 23 and one of the pair of spare terminals 13.

In other words, as shown in FIG. 4, a state where a connection failure has not occurred between the pair of relay electrodes 23 and the pair of spare terminals 13 is a state where the connector set 10 is normally connected.

[Configuration of Connector Inspection Instrument 5]

The connector inspection instrument 5 according to the present embodiment is configured to inspect a connection state of the connector set 10. The following describes the connector inspection instrument 5 with reference to FIG. 7 to FIG. 10.

Figure 7:
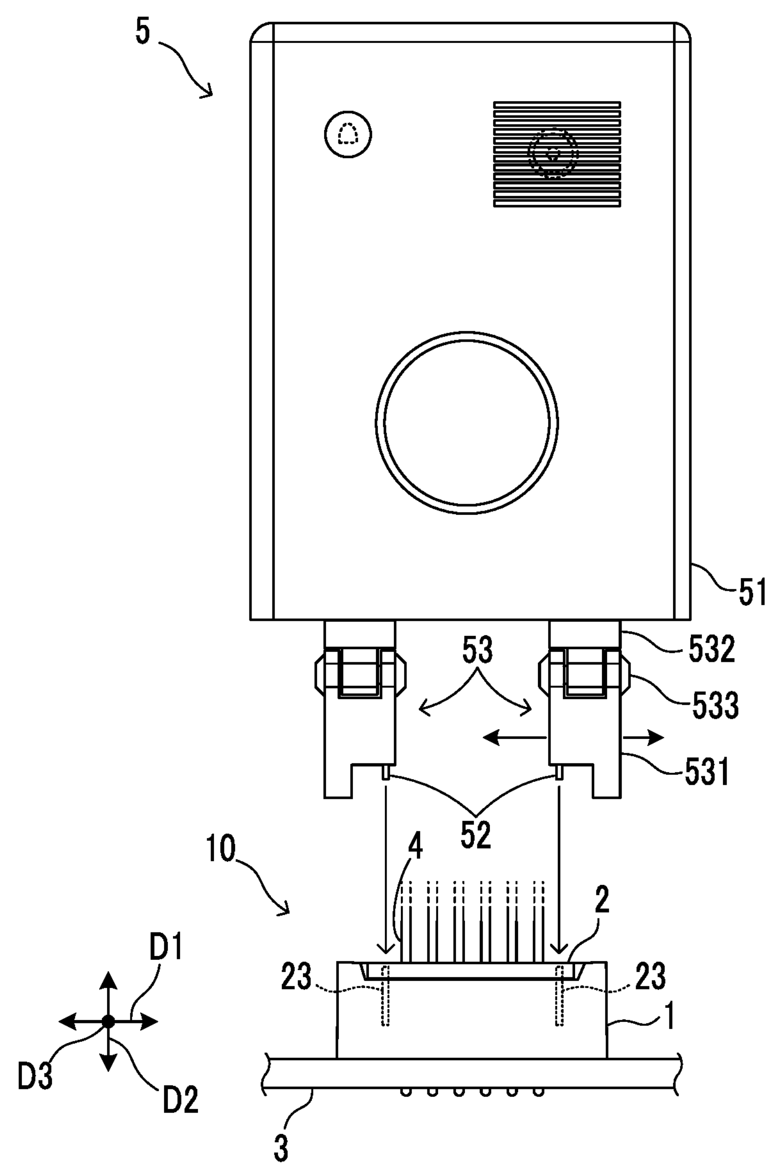
FIG. 7 is a front diagram of a connector inspection instrument and the connector set according to the embodiment.

As shown in FIG. 7, the connector inspection instrument 5 includes a main-body housing 51, a pair of inspection terminals 52, and a pair of terminal support portions 53.

Figure 8:
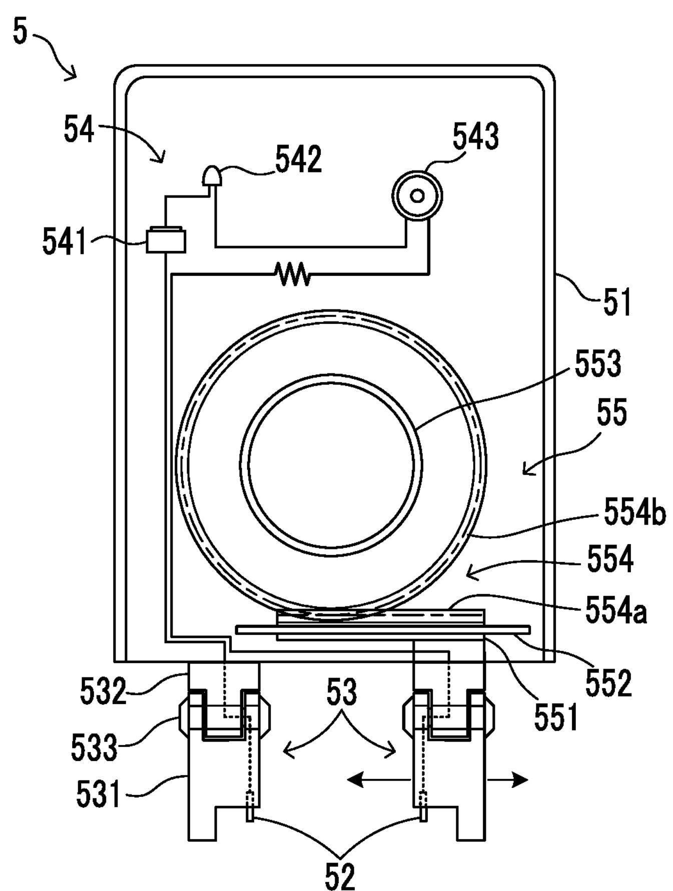
FIG. 8 is a configuration diagram of the connector inspection instrument according to the embodiment.
Figure 9:
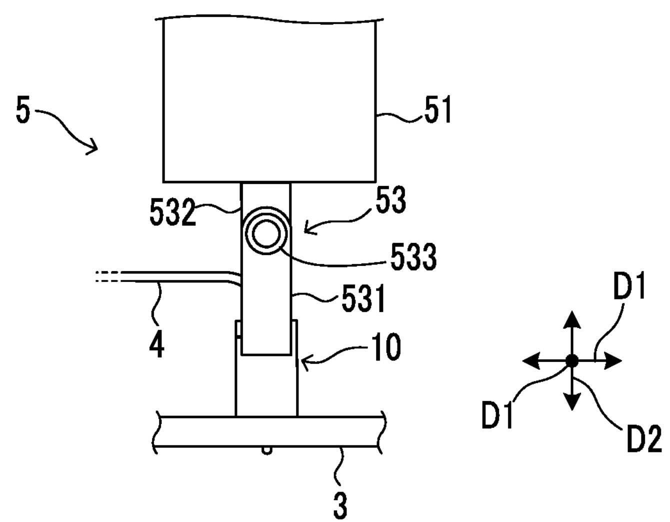
FIG. 9 is a side diagram of the connector inspection instrument according to the embodiment in a first inspection state.
Figure 10:
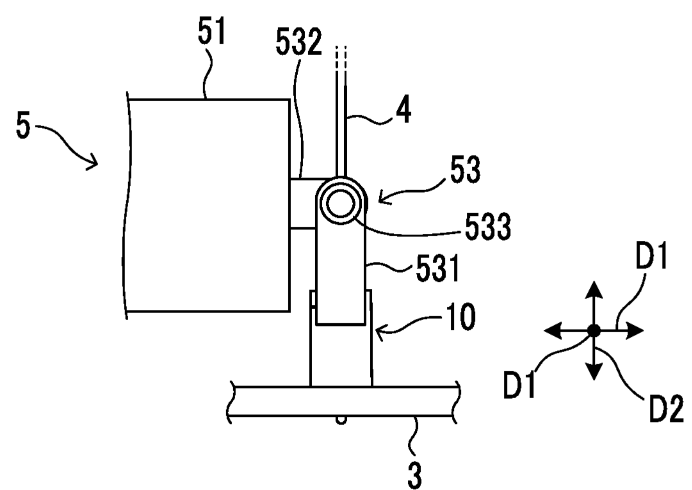
FIG. 10 is a side diagram of the connector inspection instrument according to the embodiment in a second inspection state.

Furthermore, as shown in FIG. 8, the connector inspection instrument 5 further includes a conduction detecting circuit 54 and a displacement mechanism 55. The conduction detecting circuit 54 is stored in the main-body housing 51. In the example shown in FIG. 8, the displacement mechanism 55 is also stored in the main-body housing 51.

The pair of inspection terminals 52 are conductive and brought into contact with the pair of relay electrodes 23 by an operation of an operator of the connector inspection instrument 5. The conduction detecting circuit 54 is configured to detect conduction between the pair of inspection terminals 52 by applying a voltage to the pair of inspection terminals 52.

In the example shown in FIG. 8, the conduction detecting circuit 54 includes a battery 541, an LED lamp 542, and a buzzer 543, wherein the battery 541 applies a DC voltage to the pair of inspection terminals 52. The pair of inspection terminals 52 and the LED lamp 542 are electrically connected in series to the battery 541. Similarly, the pair of inspection terminals 52 and the buzzer 543 are electrically connected in series to the battery 541.

In the example shown in FIG. 8, the LED lamp 542 and the buzzer 543 are also electrically connected in series to the battery 541. It is noted that the LED lamp 542 and the buzzer 543 may be electrically connected in parallel to the battery 541.

The LED lamp 542 is configured to light when conduction between the pair of inspection terminals 52 is detected. Similarly, the buzzer 543 is configured to output a sound when conduction between the pair of inspection terminals 52 is detected. It is noted that the buzzer 543 is an example of a sound outputting device.

During a connection inspection of the connector set 10, the pair of inspection terminals 52 are brought into contact with the pair of relay electrodes 23. At the time, if the connector set 10 is normally connected, the pair of inspection terminals 52 become conductive via the pair of relay electrodes 23, the pair of spare terminals 13, and the short circuit member 14. In that case, current flows from the battery 541 to the LED lamp 542, to the buzzer 543, and to the pair of inspection terminals 52, allowing the LED lamp 542 to light and the buzzer 543 to output a sound.

On the other hand, if the connector set 10 has a connection failure by one-side floating or the like, the pair of inspection terminals 52 are not conducted. In this case, current does not flow from the battery 541 to the LED lamp 542, to the buzzer 543, and to the pair of inspection terminals 52. As a result, the LED lamp 542 does not light, and the buzzer 543 does not output a sound.

With the above-described configuration, the inspector can easily check the connection state of the connector set 10 based on whether or not the LED lamp 542 lights, or whether or not the buzzer 543 outputs a sound.

The pair of terminal support portions 53 are formed to extend from the main-body housing 51. The pair of terminal support portions 53 support the pair of inspection terminals 52.

The displacement mechanism 55 is provided in the main-body housing 51. The displacement mechanism 55 supports one of the pair of terminal support portions 53 in such a way as to displace it in a width direction to narrow or widen an interval between the pair of inspection terminals 52.

The width direction is perpendicular to a direction in which the pair of terminal support portions 53 extend from the main-body housing 51. The width direction is also perpendicular to a direction in which the pair of inspection terminals 52 extend from the pair of terminal support portions 53.

In the example shown in FIG. 8, the displacement mechanism 55 includes a movable support member 551, a guide rail 552, an operation dial 553, and a gear mechanism 554.

The movable support member 551 is integrally formed with one of the pair of terminal support portions 53. The guide rail 552 supports the movable support member 551 such that the movable support member 551 can move in the width direction.

The operation dial 553 is rotatably supported by the main-body housing 51. The operation dial 553 is rotated by a human operation.

The gear mechanism 554 transmits a rotational force that was applied to the operation dial 553, to the movable support member 551 as a driving force in the width direction. In the example shown in FIG. 8, the gear mechanism 554 is a rack and pinion gear and includes a rack gear **554*a* and a pinion gear 554*b*, wherein the rack gear 554*a* is integrally formed with the operation dial 553, and the pinion gear 554*b* is integrally formed with the movable support member 551**.

It is noted that the gear mechanism 554 may be a combination of a warm gear and a rack and pinion gear, wherein the warm gear includes: a screw gear integrally formed with the operation dial 553; and a helical gear that meshes with the screw gear, and the rack and pinion gear includes: a pinion gear integrally formed with the helical gear; and a rack gear integrally formed with the movable support member 551.

The connector inspection instrument 5, with the displacement mechanism 55 provided therein, is applicable to a plurality of types of plugs 2 having different intervals between the pair of relay electrodes 23.

The pair of terminal support portions 53 include a pair of first terminal support portions 531, a pair of second terminal support portions 532, and a coupling mechanism 533.

The pair of first terminal support portions 531 directly support the pair of inspection terminals 52. The pair of second terminal support portions 532 are located closer to the main-body housing 51 than the pair of first terminal support portions 531.

In the present embodiment, one of the pair of second terminal support portions 532 is fixed to the main-body housing 51, and the other is supported by the displacement mechanism 55.

The coupling mechanism 533 is configured to couple the pair of first terminal support portions 531 with the pair of second terminal support portions 532 in such a manner that an angle formed by them can be changed. In the present embodiment, the coupling mechanism 533 is a hinge supporting the pair of first terminal support portions 531 such that they can pivot with respect to the pair of second terminal support portions 532.

In the present embodiment, two coupling mechanisms 533 are provided in correspondence with the pair of first terminal support portions 531. However, not limited to this, one coupling mechanism 533 may be provided in correspondence with the pair of first terminal support portions 531.

As shown in FIG. 1 and FIG. 2, the electric wires 4 extending from the plug 2 may be wired at various angles with respect to the depth direction D2. On the other hand, provided with the pair of terminal support portions 53 that include the coupling mechanism 533, the connector inspection instrument 5 can change the position of the main-body housing 51 with respect to the pair of inspection terminals 52 (see FIG. 9, FIG. 10).

Accordingly, due to the action of the pair of terminal support portions 53 that include the coupling mechanism 533, it is possible to bring the pair of first terminal support portions 531 and the pair of inspection terminals 52 into contact with the pair of relay electrodes 23 of the plug 2 by avoiding interference with the electric wires 4 no matter in what directions the electric wires 4 are wired.

The adoption of the connector inspection instrument 5 makes it easy to inspect a connection failure by one-side floating in the connector set 10.

[Application Example of Connector Inspection Instrument 5]

The following describes an application example of the connector inspection instrument 5.

In the present application example, the displacement mechanism 55 supports both of the pair of terminal support portions 53 such that they are displaced in a width direction in which an interval between the pair of inspection terminals 52 is narrowed or widened.

For example, the displacement mechanism 55 may include a pair of movable support members 551 corresponding to the pair of terminal support portions 53, and the gear mechanism 554 may include a pair of rack gears 554*a* that are respectively integrally formed with a pair of movable support members 551. In this case, the operation dial 553 and the pinion gear 554*b* are disposed between the pair of rack gears 554*a*.

In the present application example, with a rotation of the operation dial 553, the gear mechanism 554 causes the pair of movable support members 551 to move in opposite directions along the width direction. The adoption of the present application example produces the same effect as the adoption of the connector inspection instrument 5 and the connector set 10 of the above-described embodiment.

[Application Example of Connector Set 10]

The following describes an application example of the connector set 10.

In the present application example, the short circuit member 14 of the receptacle 1 is omitted. Instead, the pair of spare terminals 13 are short-circuited by a part of the pattern wiring 31 of the electronic board 3. The adoption of the present application example produces the same effect as the adoption of the connector inspection instrument 5 and the connector set 10 of the above-described embodiment.

It is to be understood that the embodiments herein are illustrative and not restrictive, since the scope of the disclosure is defined by the appended claims rather than by the description preceding them, and all changes that fall within metes and bounds of the claims, or equivalence of such metes and bounds thereof are therefore intended to be embraced by the claims.

The invention claimed is:

1. A connector inspection instrument for inspecting a connection state of a connector set that includes a receptacle and a plug, the receptacle including: a plurality of receptacle terminals that are aligned in a longitudinal direction of the receptacle; and a pair of spare terminals that are located on both sides of the plurality of receptacle terminals in the longitudinal direction and are short-circuited, the plug including: a plurality of plug terminals that respectively come in contact with the plurality of receptacle terminals when the plug is connected to the receptacle; and a pair of relay electrodes that respectively come in contact with the pair of spare terminals when the plug is connected to the receptacle, the connector inspection instrument comprising:

a pair of inspection terminals that are brought into contact with the pair of relay electrodes;

a conduction detecting circuit configured to detect conduction between the pair of inspection terminals by applying a voltage to the pair of inspection terminals;

a main-body housing storing the conduction detecting circuit;

a pair of terminal support portions formed to extend from the main-body housing and support the pair of inspection terminals; and a displacement mechanism provided in the main-body housing and configured to support one or both of the pair of terminal support portions in such a way as to displace the one or both of the pair of terminal support portions in a width direction to narrow or widen an interval between the pair of inspection terminals, wherein the plurality of receptacle terminals, the pair of spare terminals, the plurality of plug terminals, and the pair of relay electrodes are formed along a depth direction that is perpendicular to the longitudinal direction, the plug is connected to the receptacle along the depth direction, in a state where the plug is connected to the receptacle, a length in the depth direction of a region in which the pair of spare terminals overlap with the pair of relay electrodes, is shorter than a length in the depth direction of a region in which the plurality of receptacle terminals overlap with the plurality of plug terminals, the connector inspection instrument is independent of the receptacle and the plug, and the displacement mechanism includes:

an operation dial which is configured to be rotated by a manual operation; and a gear mechanism which is configured to transmit a rotational force that was applied to the operation dial, to the one or both of the pair of terminal support portions to displace the one or both of the pair of terminal support portions in the width direction.

2. The connector inspection instrument according to claim 1, wherein the pair of terminal support portions include:

a pair of first terminal support portions directly supporting the pair of inspection terminals;

a pair of second terminal support portions that are located closer to the main-body housing than the pair of first terminal support portions; and a hinge configured to couple the pair of first terminal support portions with the pair of second terminal support portions in such a manner that an angle formed thereby can be changed.

3. The connector inspection instrument according to claim 1, wherein the conduction detecting circuit includes:

a sound outputting device configured to output a sound when conduction between the pair of inspection terminals is detected.

4. A connector set comprising:

a receptacle; and a plug, wherein the receptacle includes:

a plurality of receptacle terminals that are aligned in a longitudinal direction of the receptacle;

a pair of spare terminals that are located on both sides of the plurality of receptacle terminals in the longitudinal direction and are short-circuited; and a short circuit member that is conductive and configured to short-circuit the pair of spare terminals, and the plug includes:

a plurality of plug terminals that respectively come in contact with the plurality of receptacle terminals when the plug is connected to the receptacle; and a pair of relay electrodes that respectively come in contact with the pair of spare terminals when the plug is connected to the receptacle, wherein the plurality of receptacle terminals, the pair of spare terminals, the plurality of plug terminals, and the pair of relay electrodes are formed along a depth direction that is perpendicular to the longitudinal direction, the plug is connected to the receptacle along the depth direction, and in a state where the plug is connected to the receptacle, a length in the depth direction of a region in which the pair of spare terminals overlap with the pair of relay electrodes, is shorter than a length in the depth direction of a region in which the plurality of receptacle terminals overlap with the plurality of plug terminals.

* * * * *